(12) United States Patent
Caswell et al.

(10) Patent No.: US 10,872,991 B2
(45) Date of Patent: Dec. 22, 2020

(54) METHOD AND APPARATUS OF FABRICATING A SOLAR CELL DEVICE

(71) Applicant: SUNPOWER CORPORATION, San Jose, CA (US)

(72) Inventors: Nathaniel Caswell, Sunnyvale, CA (US); David C. Hosken, Redwood City, CA (US); Jason Kalus, Redwood City, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 166 days.

(21) Appl. No.: 15/950,727

(22) Filed: Apr. 11, 2018

(65) Prior Publication Data

US 2019/0319151 A1    Oct. 17, 2019

(51) Int. Cl.
  *H01L 31/05*    (2014.01)
  *H01L 31/02*    (2006.01)
  *H01L 31/18*    (2006.01)

(52) U.S. Cl.
  CPC .... *H01L 31/0508* (2013.01); *H01L 31/02008* (2013.01); *H01L 31/18* (2013.01)

(58) Field of Classification Search
  None
  See application file for complete search history.

(56) References Cited

U.S. PATENT DOCUMENTS

| 2015/0349145 | A1 | 12/2015 | Morad et al. |
| 2015/0349153 | A1 | 12/2015 | Morad et al. |
| 2015/0349161 | A1 | 12/2015 | Morad et al. |
| 2015/0349162 | A1 | 12/2015 | Morad et al. |
| 2015/0349167 | A1 | 12/2015 | Morad et al. |
| 2015/0349168 | A1 | 12/2015 | Morad et al. |
| 2015/0349169 | A1 | 12/2015 | Morad et al. |
| 2015/0349170 | A1 | 12/2015 | Morad et al. |
| 2015/0349171 | A1 | 12/2015 | Morad et al. |
| 2015/0349172 | A1 | 12/2015 | Morad et al. |
| 2015/0349173 | A1 | 12/2015 | Morad et al. |
| 2015/0349174 | A1 | 12/2015 | Morad et al. |
| 2015/0349190 | A1 | 12/2015 | Morad et al. |
| 2015/0349193 | A1 | 12/2015 | Morad et al. |
| 2015/0349701 | A1 | 12/2015 | Morad et al. |

(Continued)

FOREIGN PATENT DOCUMENTS

WO    WO 2016/090304 A1    6/2016

OTHER PUBLICATIONS

"Mean Shift-Based Defect Detection in Multicrystalline Solar Wafer Surfaces" by Tsai et al. (Year: 2011).*

(Continued)

*Primary Examiner* — Evren Seven
(74) *Attorney, Agent, or Firm* — Oblon, McClelland, Maier & Neustadt, L.L.P.

(57) ABSTRACT

Solar cell devices as well as method and apparatus for producing solar cell devices are disclosed. Aspects of the disclosure provide a solar cell device that includes a string of solar cells. The string of solar cells are conductively connected in series and arranged in a shingled manner with sides of adjacent solar cells being overlapped. A first metal ribbon segment is conductively bonded to a front surface of an end cell, the front surface being configured to face a light incoming direction to receive energy from a light source.

15 Claims, 10 Drawing Sheets

(56) References Cited

U.S. PATENT DOCUMENTS

| | | |
|---|---|---|
| 2015/0349702 A1 | 12/2015 | Morad et al. |
| 2015/0349703 A1* | 12/2015 | Morad .................... H01L 31/05 136/251 |
| 2016/0163912 A1 | 6/2016 | Gonzalez et al. |
| 2017/0077343 A1 | 3/2017 | Morad et al. |
| 2017/0170337 A1* | 6/2017 | Yang ................... H01L 31/0201 |
| 2017/0213929 A1 | 7/2017 | Lance et al. |
| 2018/0190860 A1* | 7/2018 | Winger ............... H01L 21/6838 |
| 2018/0323333 A1 | 11/2018 | Morad et al. |

OTHER PUBLICATIONS

"Automated visual inspection in the semiconductor industry: A survey" by Huang et al. (Year: 2013).*

Extended European Search Report dated Sep. 12, 2019, in Patent Application No. 19168347.3, 9 pages.

* cited by examiner

METHOD AND APPARATUS OF FABRICATING A SOLAR CELL DEVICE

STATEMENT REGARDING FEDERALLY SPONSORED RESEARCH OR DEVELOPMENT

The invention was made with government support under Sunshot grant DE-EE0007190 awarded by The Department of Energy. The government has certain rights in the invention.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Alternative sources of energy are needed to satisfy ever increasing world-wide energy demands. Solar energy resources are abundant in many geographical regions to satisfy such demands, in part, by provision of electric power generated with solar (e.g., photovoltaic) cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
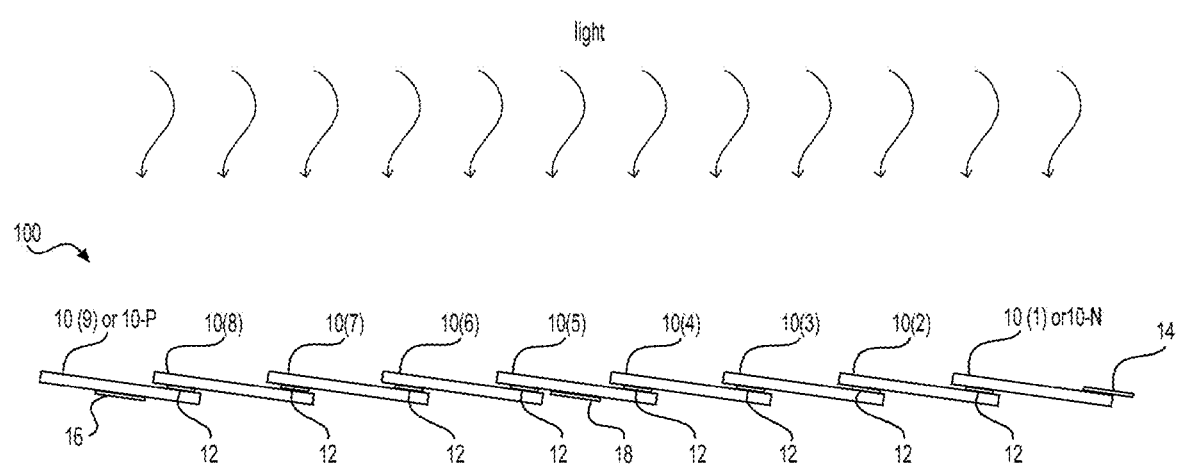
FIG. 1 illustrates a schematic cross-sectional diagram of a hyper cell/string/solar cell device arranged in a shingled manner.

The following detailed description should be read with reference to the drawings, in which identical reference numbers refer to like elements throughout the different figures. The drawings, which are not necessarily to scale, depict selective embodiments and are not intended to limit the scope of the disclosure. The detailed description illustrates by way of example, not by way of limitation, the principles of the disclosure. This description will clearly enable one skilled in the art to make and use the disclosure, and describes several embodiments, adaptations, variations, alternatives and uses of the disclosure, including what is presently believed to be the best mode of carrying out the disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" metal ribbon does not necessarily imply that this metal ribbon is the first metal ribbon in a sequence; instead the term "first" is used to differentiate this metal ribbon from another metal ribbon (e.g., a "second" metal ribbon). In an example, a first metal ribbon can be electrically connected to a hyper cell and a second metal ribbon can be electrically connected to another hyper cell, where a hyper cell can be a plurality of solar cells connected in series (as further discussed below). In addition, in an example, additional metal ribbons can be used.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B," While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners.

The current disclosure provides a solar module circuit design, as well as a method and a related apparatus to produce the solar module. In one aspect, a solar cell device can have a first string of solar cells that are interconnected together. The first string of solar cells can be arranged in line with adjacent solar cells being overlapped in a shingled manner, in which the solar cells are electrically and mechanically connected together in series. The first string of solar cells include a first metal ribbon segment. The first metal ribbon segment can be arranged to overlap a front surface of an end cell of the first solar cell string in the same shingled manner. A side portion of the metal ribbon segment can protrude beyond a side portion of the end cell. The first metal ribbon segment can be conductively bonded to a front surface of the end cell through electrically conductive adhesive (ECA) or soldering process. The front surface disclosed herein is configured to face a light incoming direction to receive energy from a light source. In some embodiments, the first metal ribbon segment is configured to act as a negative terminal connection of the first string of solar cells.

The solar cell device can further include a second string of solar cells and a second metal ribbon segment. The second metal ribbon segment is conductively bonded to the front surface of an end cell of the second sting. The second metal ribbon segment and the first metal ribbon segment can be bonded to form a first metal ribbon to provide an electrical connection between the first string and the second string of solar cells. In some embodiments, the first metal ribbon can act as a negative terminal connection of the solar cell device.

The solar cell device can include a second metal ribbon. The second metal ribbon can be electrically and mechanically bonded to a rear surface at another end of the first string and the second string of solar cells through ECA. The rear surface disclosed herein is opposite to the front surface. In some embodiments, the second metal ribbon can act as a positive terminal connection of the solar cell device. The solar cell device can further include a third metal ribbon. The third metal ribbon can be conductively bonded to the rear surface of the first string and the second string of solar cells. The third metal ribbon can be configured to connect with a bypass circuit, such as a bypass diode.

The solar cell device can further include a return metal ribbon that is configured to connect with a bypass circuit as well. The return metal ribbon is a pre-insulated metal ribbon with an end being connected to one of the metal ribbons, for example, the first metal ribbon. In one embodiment, the return metal ribbon is non-insulated, e.g., does not include any pre-insulation. Another end of the return metal ribbon can be electrically connected to a bypass circuit, such as a bypass diode.

In another aspect, an apparatus for attaching a metal ribbon onto the front side of the solar cell device can have an inspection and electrically conductive adhesive (ECA) dispensing component, a metal ribbon dispensing component, and a placement gripper component. The inspection and ECA dispensing component can be configured to inspect quality, quantity and location of a metal ribbon segment or an ECA. The inspection and ECA dispensing component can further be configured to dispense an ECA onto a metal ribbon segment. The inspection and ECA dispensing component can include an inspection camera. The inspection camera is configured to inspect the quality, quantity and location of the metal ribbon segment or the ECA. The inspection and ECA dispensing component can further include a mechanical actuator with an attached push plunger for ECA dispensing, a replaceable ECA syringe to contain the ECA and inject the ECA, and a vertical travel slide operated pneumatically to adjust positions of the inspection and ECA dispensing component vertically. The metal ribbon dispensing component can be configured to prepare a metal ribbon segment for fabricating the solar cell device. The metal ribbon dispensing component can include a gripper, a cutter, a ribbon reel with tensioner, a ribbon guide pulley, a rotary travel stage, a linear travel stage in Y axis, and a vacuum chuck. The placement gripper component can be configured to pick up and transfer a prepared metal ribbon segment. The placement gripper component can have one or more solenoids operated pneumatically for actuating suction, a linear travel stage in X axis, a linear travel stage in Y axis, a linear travel stage in Z axis and a gripper head.

In another aspect, a method for attaching a metal ribbon onto a solar cell device based on the apparatus disclosed above includes preparing the first metal ribbon segment and dispensing an ECA onto the first metal ribbon segment. The method also includes placing a first solar cell onto the first metal ribbon segment to bond the first solar cell with the first metal ribbon segment through the ECA in the shingled manner with sides of the first metal ribbon segment and the first solar cell being overlapped. The method further includes bonding one or more solar cells with the first solar cell through the ECA in the shingled manner with sides of adjacent solar cells being overlapped.

In the current disclosure, the solar module includes multiple hyper cells, such as six hyper cells, for example. The hyper cells can be arranged in rows that are connected in parallel or in series. Electrical connections between the hyper cells can be made through metal ribbons. Each hyper cell can include a string of solar cells. The string of solar cells can be arranged in a line with adjacent solar cells being overlapped in a shingled manner. In an example, the solar cells are conductively bonded with adjacent solar cells in the overlapped regions to conductively connect the solar cells in series.

Generally, a solar cell has a front surface and a rear surface. The front surface is configured to face a light incoming direction during operation to receive energy from a light source, and the rear surface is opposite to the front surface. Each solar cell includes contacts at the front surface and the back surface to form a positive terminal (e.g., hole outgoing terminal or electron incoming terminal) and a negative terminal (e.g., hole incoming terminal or electron outgoing terminal). Depends on the solar cell design, the positive terminal can be formed on the front surface and the negative terminal can be formed on the rear surface in an example, or the positive terminal can be formed on the rear surface and the negative terminal can be formed on the front surface in another example. In the present disclosure, solar cells with positive terminals formed on the front surface and negative terminals formed on the rear surface are used as an example, the disclosed techniques can be suitably modified to apply to solar cells with negative terminals formed on the front surface and positive terminals formed on the rear surface.

In an example, when a first solar cell and a second solar cell are bonded in series, the positive terminal of the first solar cell is bonded with the negative terminal of the second solar cell, thus the negative terminal of the first solar cell can be a negative terminal of the two serially bonded solar cells, and the positive terminal of the second solar cell can be a positive terminal of the two serially bonded solar cells. Similarly, when more than two solar cells are bonded in series to form a hyper cell, the hyper cell has a positive terminal and a negative terminal respectively at two end solar cells of the serially connected solar cells. The end solar cell for the positive terminal is referred to as a positive end, and the end solar cell for the negative terminal is referred to as a negative end. The hyper cell can be connected to other components, such as other hyper cells, a bypass circuit, and the like by connections to the positive terminal and the negative terminal of the hyper cell.

According to an aspect of the disclosure, metal ribbons are disposed at positive end and negative end of a hyper cell to serve as positive terminal connection and negative terminal connection of the hyper cell. The metal ribbons are used to connect the hyper cell to other components, such as other hyper cells, bypass circuits, and the like of the solar module. In an example, a first metal ribbon is disposed on the front surface at a negative end of a hyper cell to form a negative terminal connection of the hyper cell and a second metal ribbon is disposed on the rear surface at a positive end of the hyper cell to form a positive terminal connection of the hyper cell. In addition, in an example, additional metal ribbons are used to connect the hyper cell to a bypass circuit, such as a bypass diode. For example, a third metal ribbon can be used to connect the negative terminal connection to a bypass diode.

According to an aspect of the disclosure, discrete metal ribbon segments are disposed respectively on the front surface of end solar cells of different hyper cells, and the discrete metal ribbons can be bonded to form the first metal ribbon and provide connections between the hyper cells. Thus, the metal ribbon disposing step can be integrated in an assembly process for a hyper cell, and can be conducted automatically by equipment in a manufacturing assembly line.

In a related example, two continuous metal ribbons are bonded to the rear surface of multiple hyper cells to serve as connections between the multiple hyper cells. In the related example, each hyper cell can have a sacrificial cell that cannot contribute to the output power.

In another related example, a hyper cell can be flipped over during assembling to enable metal ribbon segment attachments onto the front surface or the back surface of an end cell. The flip process may cause solar cell breakage.

In some embodiments of the present disclosure, a fabrication method can be implemented through the disclosed apparatus to prepare, inspect and bond a metal ribbon segment onto the front surface of a hyper cell at the negative end automatically during an assembly of the hyper cell. In the current disclosure, preparing a metal ribbon segment is referred to as a process in which a metal ribbon roll is supplied to a cutter and a portion of the metal ribbon roll is separated by the cutter from the ribbon roll. The separated portion of the metal ribbon roll is referred to as a metal ribbon segment. The disclosed apparatus conducts multiple assembly steps in a single stage. In an example, all of the solar cells in the hyper cell can contribute to the output power. The method and the apparatus disclosed herein provide an automatic manufacturing process with an increased yield and a reduced labor cost.

FIG. 1 shows a schematic cross-sectional diagram of a hyper cell 100. The hyper cell 100 includes a string of series-connected solar cells 10. The string of solar cells 10 can be arranged in a shingled manner with adjacent solar cells being overlapped. The overlapped portion of adjacent solar cells can have a width of 1 millimeter, for example. Each solar cell 10 can include a semiconductor diode structure and one or more electrical contacts. The electrical contacts are configured to provide a positive terminal and a negative terminal for the semiconductor diode structure. Electric current can be generated in the solar cell 10 by the semiconductor diode when the solar cell 10 is exposed to light and the electric current may be provided to an external load.

In an embodiment, each solar cell 10 is made on a silicon substrate. The silicon substrate is suitably doped to form a P-N junction. For example, the silicon substrate is doped to form an n-type layer on top of a p-type layer. Further, the silicon substrate is patterned to form metal patterns on surfaces, such as a front surface (e.g., top of the silicon substrate) and a rear surface (bottom of the silicon substrate) of the silicon substrate. For example, the metal patterns on the front surface form contacts for the n-type layer and are referred to as a negative terminal of the solar cell 10, and the metal patterns on the rear surface form contacts for the p-type layer and are referred to as a positive terminal of the solar cell. It is noted that other material systems, diode structures, physical dimensions, or electrical contact arrangements may be used if suitable. For example, the front (facing to the light source) surface metallization pattern may be disposed on a semiconductor layer of p-type conductivity, and the rear (shaded side) surface metallization pattern disposed on a semiconductor layer of n-type conductivity.

Solar cells 10 may be prepared, for example, by separating a solar cell (e.g., of a square shape or pseudo square shape) into two or more (i.e., N) rectangular solar cells. For example, a solar cell of a square shape has a side length of 156 millimeters. In an example, the solar cell is cut into N rectangular solar cells (N is positive integer that is larger than one) by evenly spaced cutting lines (e.g., N−1 cutting lines) along a side direction of the square shape. The length of each solar cell equals to the side length (e.g., 156 millimeters) of the solar cell. The width of each solar cell can be a fraction (i.e., about 1/N) of the side length of the solar cell. In another example, the solar cell is cut into N×P solar cells by perpendicular cutting lines, such as a first set of evenly spaced cutting lines (e.g., N−1 evenly spaced cutting lines) along a first side direction of the square shape, and a second set of evenly spaced cutting lines (e.g., P−1 evenly spaced cutting lines) along a second side direction that is perpendicular to the first side direction of the square shape. In this example, each solar cell can have a width of about 1/N of the side length of the solar cell wafer and a length of about 1/P of the side length of the solar cell wafer. For example, for N=6 and P=2, a solar cell wafer having side lengths of 156 millimeters can provide 12 rectangular solar cells 10, and each solar cell 10 has a width of about 26 millimeters and a length of about 78 millimeters.

Specifically, in the FIG. 1 example, a schematic cross-sectional diagram of the hyper cell 100 includes 9 solar cells 10(1)-10(9) that are connected in series, the solar cell 10(1) is also referred to as a first end solar cell 10-N of the hyper cell 100 and the solar cell 10(9) is also referred to as a second end solar cell 10-P of the hyper cell 100. The hyper cell 100 includes a first metal ribbon 14 that is conductively bonded on the front surface of the first end solar cell 10-N and a second metal ribbon 16 that is conductively bonded on the rear surface of the second end solar cell 10-P. In an example, the first metal ribbon 14 is configured to overlap a front surface of the first end solar cell 10-N in a shingled manner at an end of the hyper cell 100. The first metal ribbon 14 is conductively bonded to the front surface of first end solar cell 10-N through an electrically conductive adhesive (ECA) 12, and acts as a negative terminal connection of the hyper cell 100. The end cell at which the first metal ribbon is located can be identified as a negative end of the hyper cell. The front surface disclosed herein is configured to face a light incoming direction to receive energy from a light source. The second metal ribbon 16 is bonded onto a rear surface of the second end solar cell 10-P located at another end of the hyper cell 100. The second metal ribbon 16 is configured to act as a positive terminal connection of the hyper cell 100. Correspondingly, the end cell at which the second metal ribbon is located can be identified as a positive end of the hyper cell. The rear surface disclosed herein is opposite to the front surface. The hyper cell can include a third metal ribbon 18. The third metal ribbon 18 can be bonded to a rear surface of a third solar cell in the hyper cell 100. The third metal ribbon 18 can be configured to connect with a bypass circuit, such as a bypass diode. A fourth metal ribbon, a fifth metal ribbon or more metal ribbons can be used. In an example, more than one metal ribbon can be used for when using a second bypass diode, third bypass diode or when using a plurality of bypass diodes. In the hyper cell 100, the interconnection between two adjacent solar cells or between a solar and a metal ribbon can be implemented through an electrically conductive adhesive (ECA) 12.

Figure 2A:
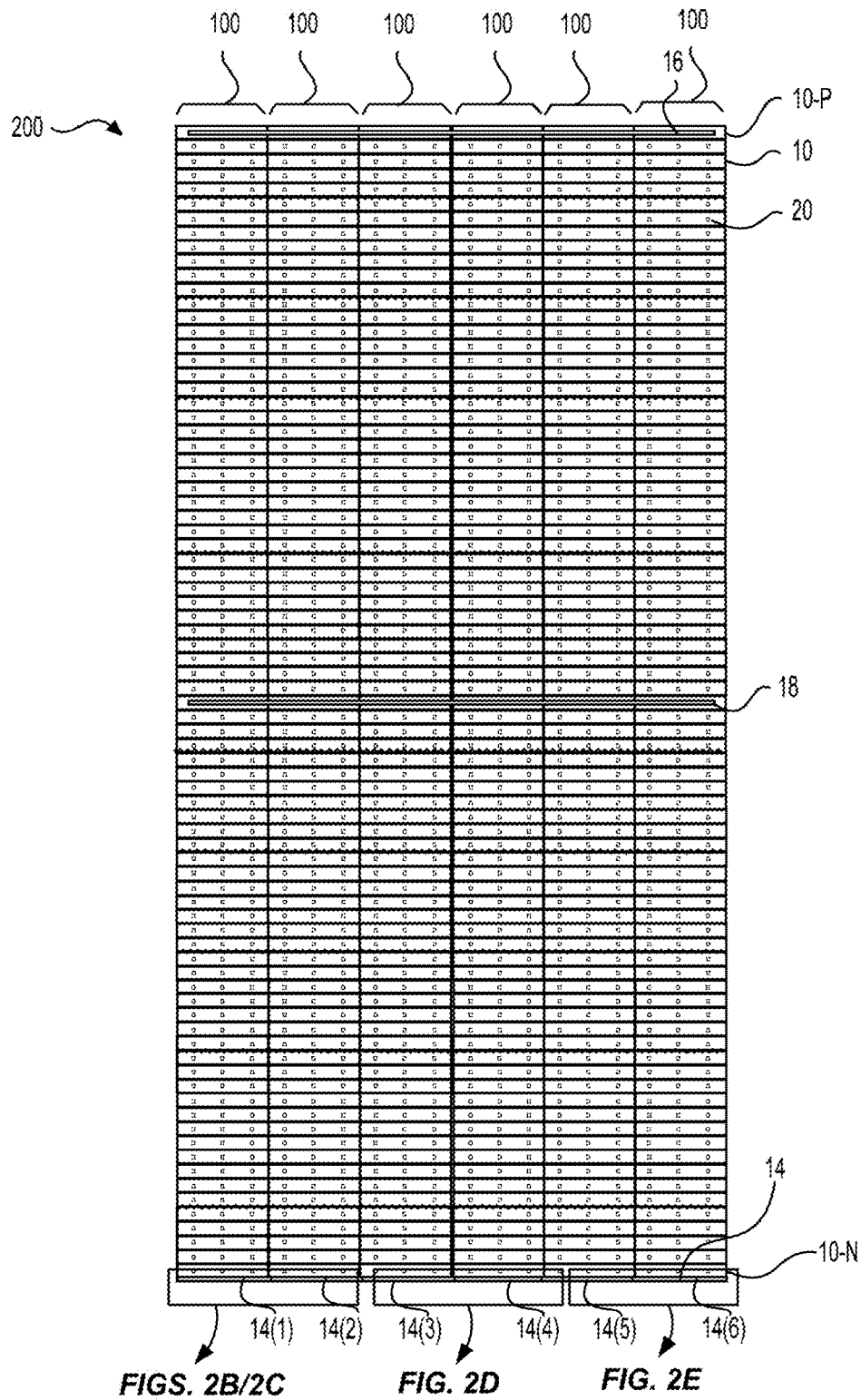
FIG. 2A illustrates a schematic diagram of a rear surface of an exemplary solar module.

FIG. 2A illustrates a schematic diagram of a rear surface of an exemplary solar module 200. The solar module 200 can include one or more shingled hyper cells 100, such as six hyper cells 100. Electrical connections between the hyper cells can be made through metal ribbons. In an embodiment, as shown in FIG. 2A, a long side of each hyper cell can have a length of approximately a full length of a long side of the module 200. The hyper cells 100 are arranged as six parallel rows. A similarly configured solar module may include more or fewer rows of such hyper cells. In another embodiment, the hyper cells may each have a length of a long side approximately equal to a length of a short side of a solar module, and be arranged in parallel rows with long sides oriented parallel to the short sides of the module. In yet other embodiments, each row may include two or more hyper cells, which may be electrically interconnected in series for example. The solar module 200 illustrated in FIG. 2A may have short sides having a length, for example, of about 1 meter and long sides having a length, for example, of about 1.5 to about 2.0 meters. Any suitable shapes and dimensions for the solar modules may also be used. A hyper cell may comprise any suitable number of solar cells of any suitable dimensions. Similarly, a row of hyper cells may comprise any suitable number of solar cells of any suitable dimensions arranged in one or more hyper cells.

Still referring to FIG. 2A, any other suitable series, parallel, or series and parallel electrical interconnection of the hyper cells in a solar module may also be used. Electrical connections between the hyper cells can be made through metal ribbons.

Still illustrated in FIG. 2A, the six hyper cells 100 are electrically interconnected in parallel by the first metal ribbon 14 on the front surface at an end of the solar module 200. The first metal ribbon 14 is formed by connecting multiple discrete metal ribbon segments together. Specifically, in the FIG. 2A example, the first metal ribbon 14 is formed by bonding 6 discrete metal ribbon segments 14(1)-14(6) together. As shown in FIG. 2A, discrete metal ribbon segments 14(1)-14(6) are disposed respectively for different hyper cells at the negative terminals, and the discrete metal ribbon segments 14(1)-14(6) are bonded to form the first metal ribbon 14 and form connections between the hyper cells. In some embodiments, each metal ribbon segment can have a dimension of 165 millimeters long, 10 millimeters wide, and 0.08 millimeter thick, for example. The first metal ribbon 14 connects the negative terminals of the hyper cells 100 and acts as a negative terminal connection of the solar module 200. The end at which the first metal ribbon 14 is located can be identified as a negative end of the solar module 200. The first metal ribbon 14 can be bonded to the front surface of the solar module 200 and arranged to overlap the negative end of the solar module 200 in a shingled manner. A side portion 14' of the ribbon can protrude beyond a side portion 10-N' of the solar module 200 (shown in FIG. 2B).

In solar module 200, six hyper cells 100 are electrically interconnected in parallel by the second metal ribbon 16 at another end of the solar module 200. As shown in FIG. 2A, the second metal ribbon 16 can be connected to another end of the solar module 200 on the rear surface. The second metal ribbon 16 can be a continuous metal ribbon and connect the positive terminals of the hyper cells 100. Correspondingly, the second metal ribbon 16 acts as a positive terminal connection of the solar module 200. The end at which the second metal ribbon 16 is located can be labelled as a positive end of the solar module 200.

The solar module 200 can further include a third metal ribbon 18. The third metal ribbon 18 can also be a continuous metal ribbon. The third metal ribbon 16 can be bonded to the solar module 200 on the rear surface and runs transversely across the rows of hyper cells to connect with a bypass circuit, such as a bypass diode. The solar module 200 can further have a return metal ribbon 24 (shown in FIG. 2D) that is configured to connect to a bypass circuit. Illustrated in FIG. 2D, the return metal ribbon 24 can be a pre-insulated metal ribbon with an end perpendicularly connected to one of the metal ribbons, for example, the first metal ribbon 14. In one embodiment, the return metal ribbon 24 is a non-insulated metal ribbon. Another end of the return metal ribbon can be electrically connected to a bypass circuit, such as a bypass diode. Typically, though not necessarily, the solar modules described herein include one or more bypass diodes. If a solar cell arranged electrically in parallel with one of the bypass diodes significantly limits current due to shading, cracking, or otherwise suboptimal cell performance, the bypass diode will become forward biased and electrically bypass that solar cell or a portion of the module including that solar cell. This prevents formation of a dangerous hot spot around the current limiting cell and improves performance of the module. It should be noted that a plurality of contact pads 20 can be formed on the rear surface of each solar cell 10 in the solar module 200. The contact pad 20 provides interconnection. For example, in the shingled hyper cell 100, contact pad 20 on the rear surface can be bonded to a metal ribbon. The contact pad 20 can also be bonded to contact pads on the front surface of an adjacent overlapping solar cell to electrically connect the two solar cells in series.

Figure 2B:
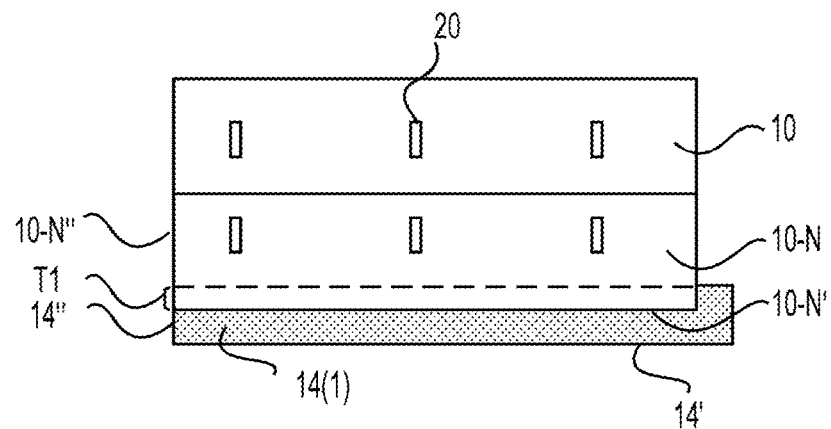
FIG. 2B illustrates an expanded view of an exemplary interconnection of a metal ribbon to a hyper cell on a front surface.

FIG. 2B illustrates an expanded view of an exemplary interconnection of the first metal ribbon 14 to the hyper cell 100 at the negative end on the front side, where the hyper cell 100 is the first row of the solar module 200 from left side. As mentioned above, the first metal ribbon 14 is formed by connecting multiple discrete metal ribbon segments together. The portion of the first metal ribbon 14 illustrated in FIG. 2B is actually a metal ribbon segment 14(1). The metal ribbon segment 14(1) is bonded onto the front surface of the first end solar cell 10-N of hyper cell 100. The metal ribbon segment 14(1) can be arranged to overlap the first end solar cell 10-N in a shingled manner. The overlapped portion of the first end solar cell 10-N and the metal ribbon segment 14(1) can have a width T1 of 3 millimeters, for example. A side portion 14' of the metal ribbon 14(1) can protrude beyond a side portion 10-N' of the solar cell 10-N. Shown in FIGS. 2A and B, the solar cell 100 illustrated herein is the first row of the solar module 200 from left side, and an edge portion 14" of the metal ribbon 14(1) is level with an edge portion 10-N" of the solar cell 10-N from left side.

Figure 2C:
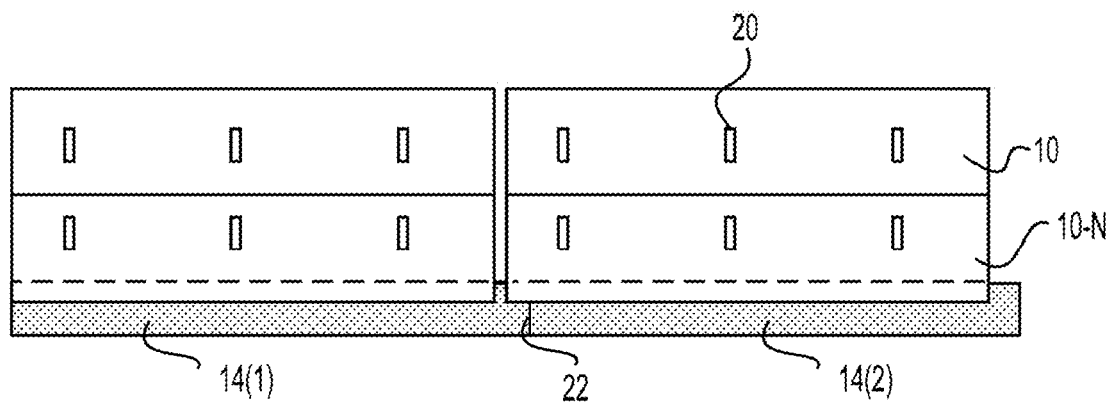
FIG. 2C illustrates an expanded view of an exemplary interconnection of two adjacent solar cells.

FIG. 2C illustrates another expanded view of an exemplary interconnection of two adjacent hyper cells 100 on rear surfaces through metal ribbon segments 14(1) and 14(2). As shown in FIG. 2C, two adjacent hyper cells are connected through metal ribbon segments 14(1) and 14(2). The two metal ribbon segments are bonded to front surfaces of the hyper cells and connect the two hyper cells together. The two metal ribbon segments 14(1) and 14 (2) are bonded through a solder point 22. In an embodiment, metal ribbon segments are soldered together manually. In another example, metal ribbon segments can be soldered through an automated process.

Figure 2D:
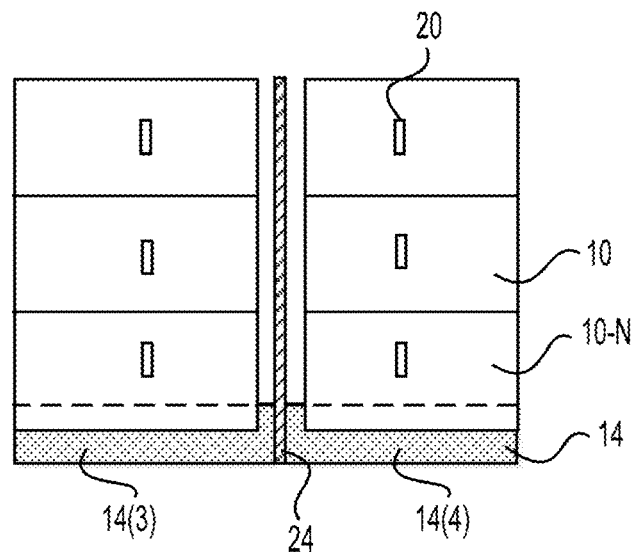
FIG. 2D illustrates an expanded view of an exemplary interconnection of a return metal ribbon to a metal ribbon.

FIG. 2D illustrates an expanded view of an exemplary interconnection of a return metal ribbon 24 to the first metal ribbon 14. As shown in FIG. 2D, the first metal ribbon 14 can includes two discrete metal ribbon segments 14(3) and 14(4). The first metal ribbon 14 is connected to the solar module 200 at the negative end on the front side, and the return ribbon 24 is vertically connected with the first metal ribbon 14. The return ribbon 24 is located on the rear surface of the solar module 200. As mentioned above, the return metal ribbon 24 is a pre-insulated metal ribbon. An end of the metal ribbon 24 can be connected with one of the metal ribbons, for example, the first metal ribbon 14, and another end of the return metal ribbon can be electrically connected with a bypass circuit, such as a bypass diode (not shown).

Figure 2E:
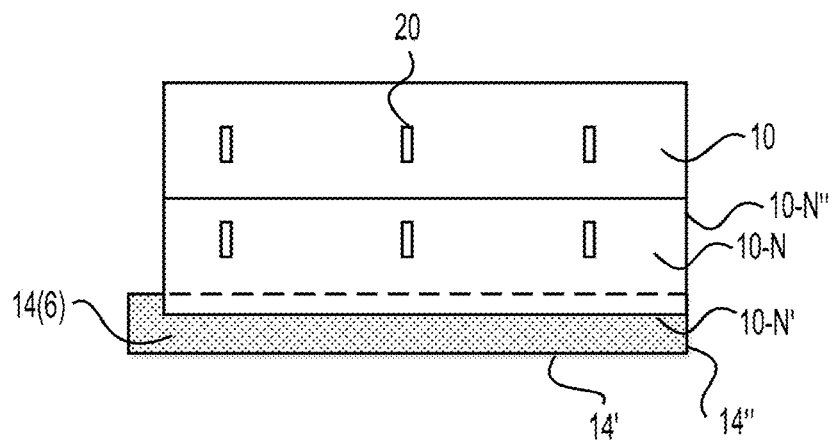
FIG. 2E illustrates another expanded view of an exemplary interconnection of a metal ribbon to a hyper cell on a front surface.

FIG. 2E illustrates another expanded view of an exemplary interconnection of the metal ribbon 14 to the hyper cell 100 at the negative end on the front side. The hyper cell 100 is the first row of the solar module 200 from right side. As mentioned above, the first metal ribbon 14 is formed by connecting multiple discrete metal ribbon segments together. The portion of the first metal ribbon 14 illustrated in FIG. 2E is actually a metal ribbon segment 14(6). As shown in FIG. 2E, the metal ribbon segment 14(6) is bonded to the front surface of the first end solar cell 10-N of hyper cell 100 and arranged to overlap the solar cell 10-N in a shingled manner. A side portion 14' of the metal ribbon segment 14(6) can protrude beyond a side portion 10-N' of the first end solar cell 10-N. As shown in FIGS. 2A and 2E, the hyper cell 100 disclosed herein is a first row of the solar module 200 from right side. An edge portion 14" of the metal ribbon segment 14(6) is level with an edge portion 10-N" of the first end solar cell 10-N from right side.

Figure 3A:
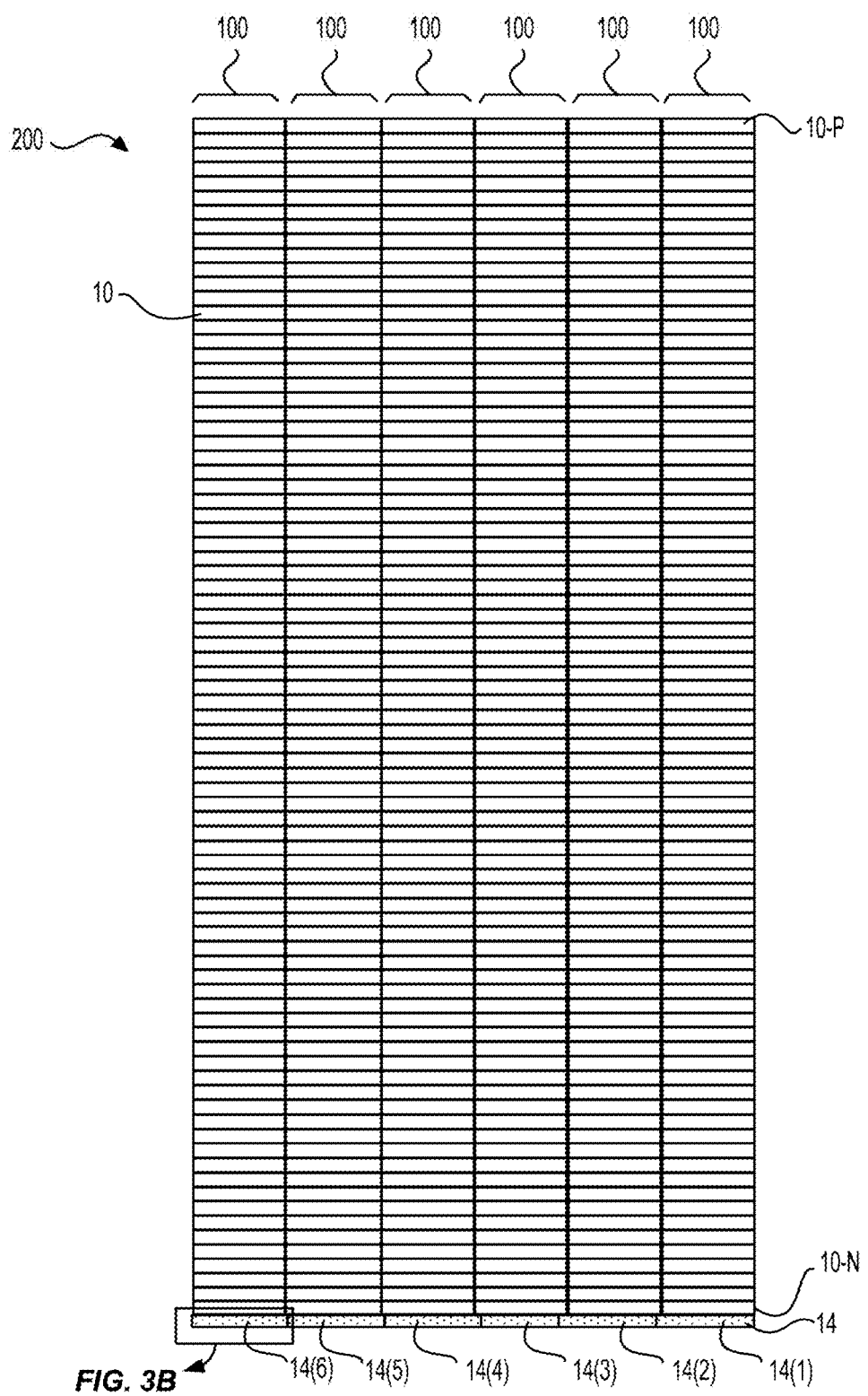
FIG. 3A illustrates a schematic diagram of a front surface of an exemplary solar module.
Figure 3B:
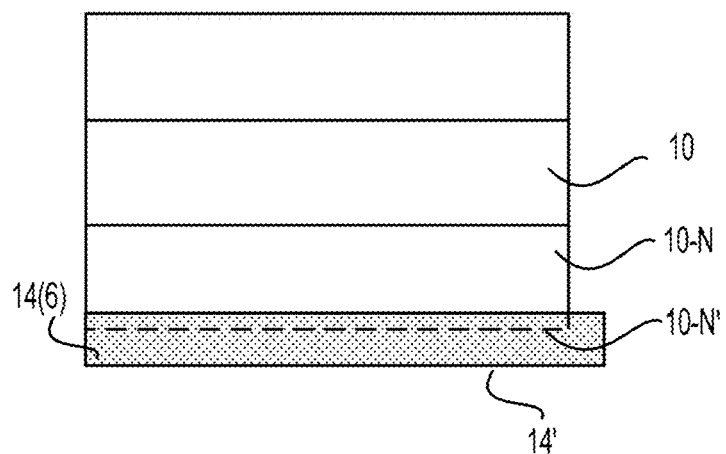
FIG. 3B illustrates an expanded view of a front surface of a solar module.

FIG. 3A illustrates a schematic diagram of the front surface of an exemplary solar module 200. The solar module 200 can have six shingled hyper cells 100. A long side of each hyper cell can have a length of approximately a full length of a long side of the solar module. Shown in FIG. 3A, the first metal ribbon 14 is bonded onto the front surface and located at the negative end of the solar module 200. The first metal ribbon 14 is formed by connecting multiple discrete metal ribbon segments together. Specifically, in the FIG. 3A example, the first metal ribbon 14 is formed by bonding 6 discrete metal ribbon segments 14(1)-14(6) together. FIG. 3B illustrates an expanded view of the front surface of the solar module. As shown in FIG. 3B, the portion of the first metal ribbon 14 is actually a metal ribbon segment 14(6). The metal ribbon segment 14(6) is bonded to the front surface of the first end solar cell 10-N of hyper cell 100 and arranged to overlap the solar cell 10-N in a shingled manner. The hyper cell 100 is the first row of the solar module 200 from left side. A side portion 14' of the metal ribbon segment 14(6) can protrude beyond a side portion 10-N' of the first end solar cell 10-N. It should be noted that front surface metallization of the solar cells are not shown in FIGS. 3A and 3B.

Figure 4:
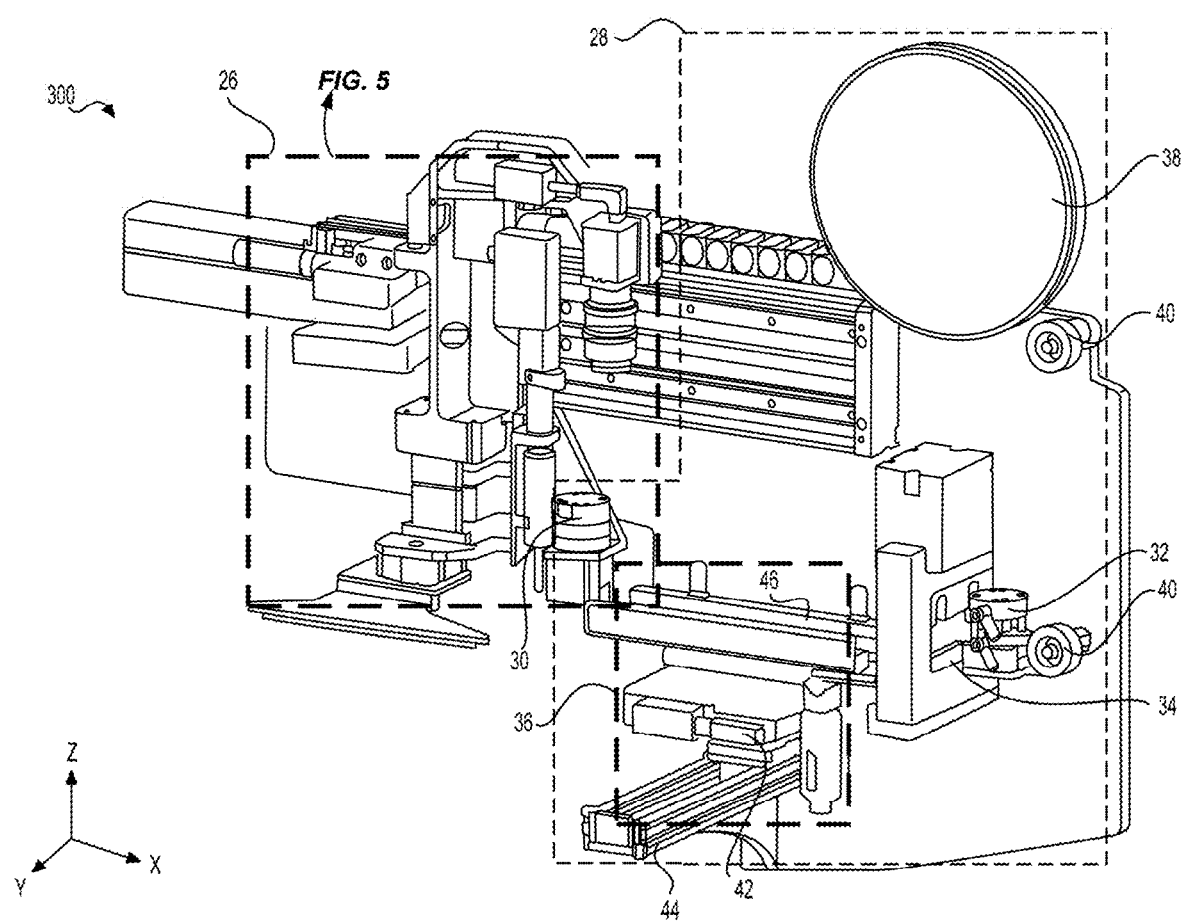
FIG. 4 illustrates a schematically perspective view of an exemplary apparatus for attaching a metal ribbon onto a solar cell device.

FIG. 4 illustrates a perspective view of an exemplary apparatus 300 for attaching a metal ribbon onto a solar cell device in accordance with some embodiments. In an example, the apparatus 300 is used to assemble a hyper cell, such as a hyper cell 100. The apparatus 300 can include a main stage 26 and a metal ribbon dispensing component 28. The main stage 26 can further include a placement gripper component 68 (shown in FIG. 5), and an inspection and ECA dispensing component 58 (shown in FIG. 6). The details of main stage 26 can be explained with reference to FIGS. 5 and 6.

Still referring to FIG. 4, the metal ribbon dispensing component 28 is configured to prepare a segment of metal ribbon, such as one of the metal ribbon segments 14(1)-14(6) during an assembly of a hyper cell, such as a hyper cell 100. The ribbon dispensing component 28 can have a gripper A 30 which is attached to the main stage 26, a gripper B 32, a cutter 34, an alignment stage 36, a ribbon reel with tensioner 38, and several ribbon guide pulleys 40. The alignment stage 36 disclosed herein can further include a rotary travel stage 42, a linear travel stage 44 in Y axis, and a vacuum chuck 46.

During a metal ribbon segment preparation process, the ribbon reel 38 supplies a roll of metal ribbon. An end of the roll is guided by the ribbon guide pulleys 40, and can pass through a cut window of the cutter 34 to wait to be gripped by the gripper A 30. The gripper A 30 is attached to the main stage 26 as shown in FIG. 4. The main stage 26 then moves toward the cutter 34 along the X axis, and the gripper A 30 moves with the main stage 26 to pick up the end of roll. The gripper A 30 can clamp the end of the roll. Then, the main stage 26 moves away from the cutter 34 along the X axis and stops, and thus the gripper A 30 pulls the end of the roll out to a proper length for a segment of metal ribbon. Then the gripper B 32 clamps on a position of the pullout portion of the metal ribbon to hold the pullout portion. The main stage 26 further pulls the end tight and, in an example, deforms the pullout portion of the metal ribbon by a few millimeters. Subsequently, the cutter 34 moves forward and cuts the metal ribbon, thus the segment of metal ribbon is separate from the roll of metal ribbon. The segment of metal ribbon is then sucked by the vacuum chuck 46 located at the alignment stage 36. The cutter 34 then moves back to original position. The gripper A 30 unclamps the segment of metal ribbon. The segment of metal ribbon lies down onto the vacuum chuck 46. The segment of metal ribbon is referred to as a metal ribbon segment, such as one of the metal ribbon segments 14(1)-14(6). In an example, the main stage 26 (including the gripper A 30) can move away from the cutter 34 along the X axis to return to its original position.

Figure 5:
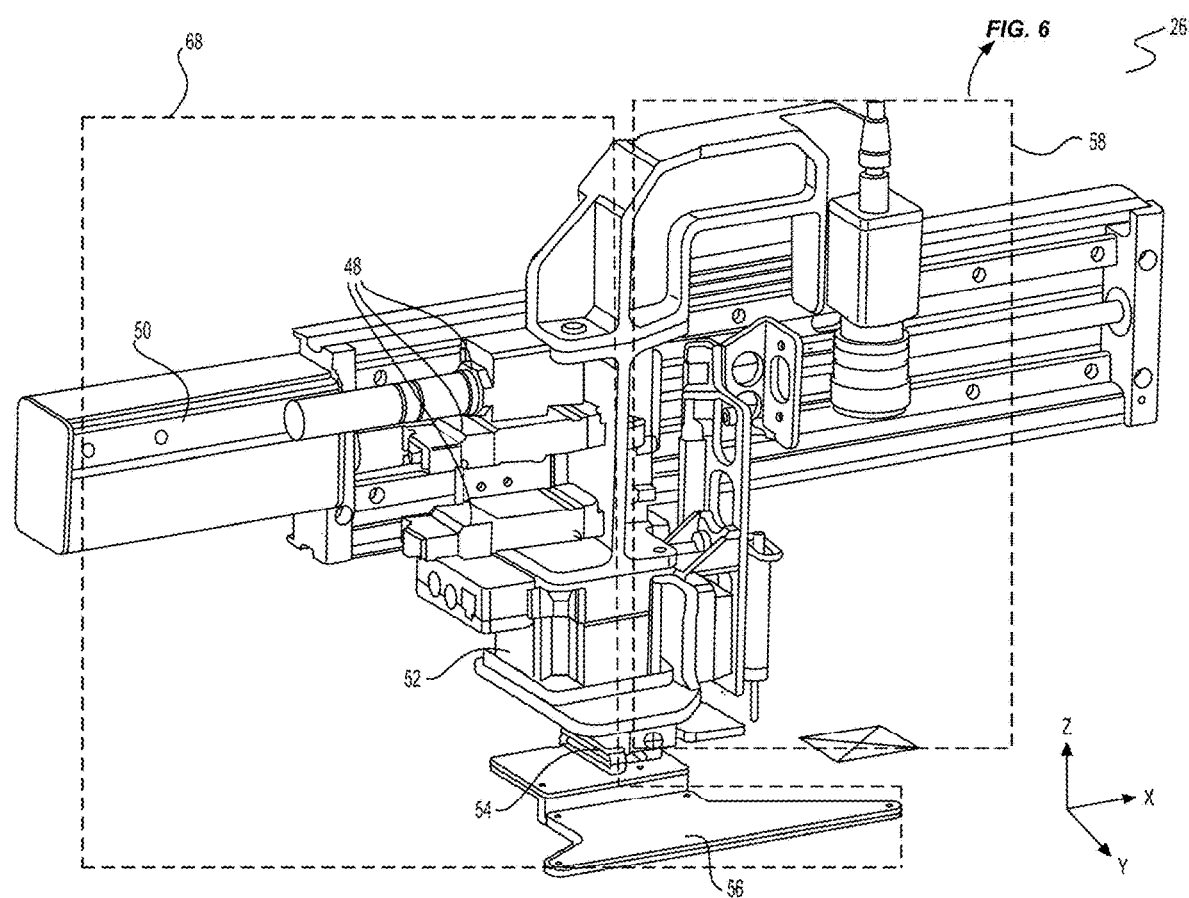
FIG. 5 illustrates a schematically perspective view of a main stage in the apparatus, in accordance with some embodiments.

FIG. 5 illustrates a perspective view of the main stage 26 in the apparatus 300 according to an embodiment of the disclosure. The main stage 26 includes the placement gripper component 68, and the inspection and ECA dispensing component 58, in accordance with some embodiments of the disclosure. The main stage 26 is configured to conduct multiple assembly steps in a single stage. The main stage 26 is configured to conduct, for example, metal ribbon gripping, metal ribbon stretching, camera inspection of metal ribbon, camera inspection of ECA, ECA dispensing, pickup of the metal ribbon segment and placement of the metal ribbon segment. As shown in FIG. 5, the placement gripper component 68 can include air solenoids 48, a linear travel stage 50 in X axis, a linear travel stage 52 in Z axis, a travel slide 54 in Y axis, and a gripper head 56. The travel slide 54 is configured to operate pneumatically. The linear travel stage 50 can have a travel range from 0 millimeter to 320 millimeters in X axis. The linear travel stage 52 can have a travel range from 0 millimeter to 3 millimeters in Z axis, and travel slide 54 operated pneumatically can have a travel range from 0 millimeter to 5 millimeters in Y axis.

During manufacturing, the travel stages 50 and 52, and travel slide 54 can be configured to adjust positions of the main stage 26 to complete functions, such as ribbon gripping and stretching, camera inspection of metal ribbon and ECA, ECA dispensing, and pick and placement of the metal ribbon segment. The gripper head 54 can be configured to pick up the metal ribbon segment from the vacuum chuck 46, or place the metal ribbon segment to a cure belt (not shown). The air solenoids 48 are configured to actuate suction which can be applied during picking and placing metal ribbon segment. The gripper head 54 can either perform suction or stop suction controlled by the air solenoids 48.

Figure 6:
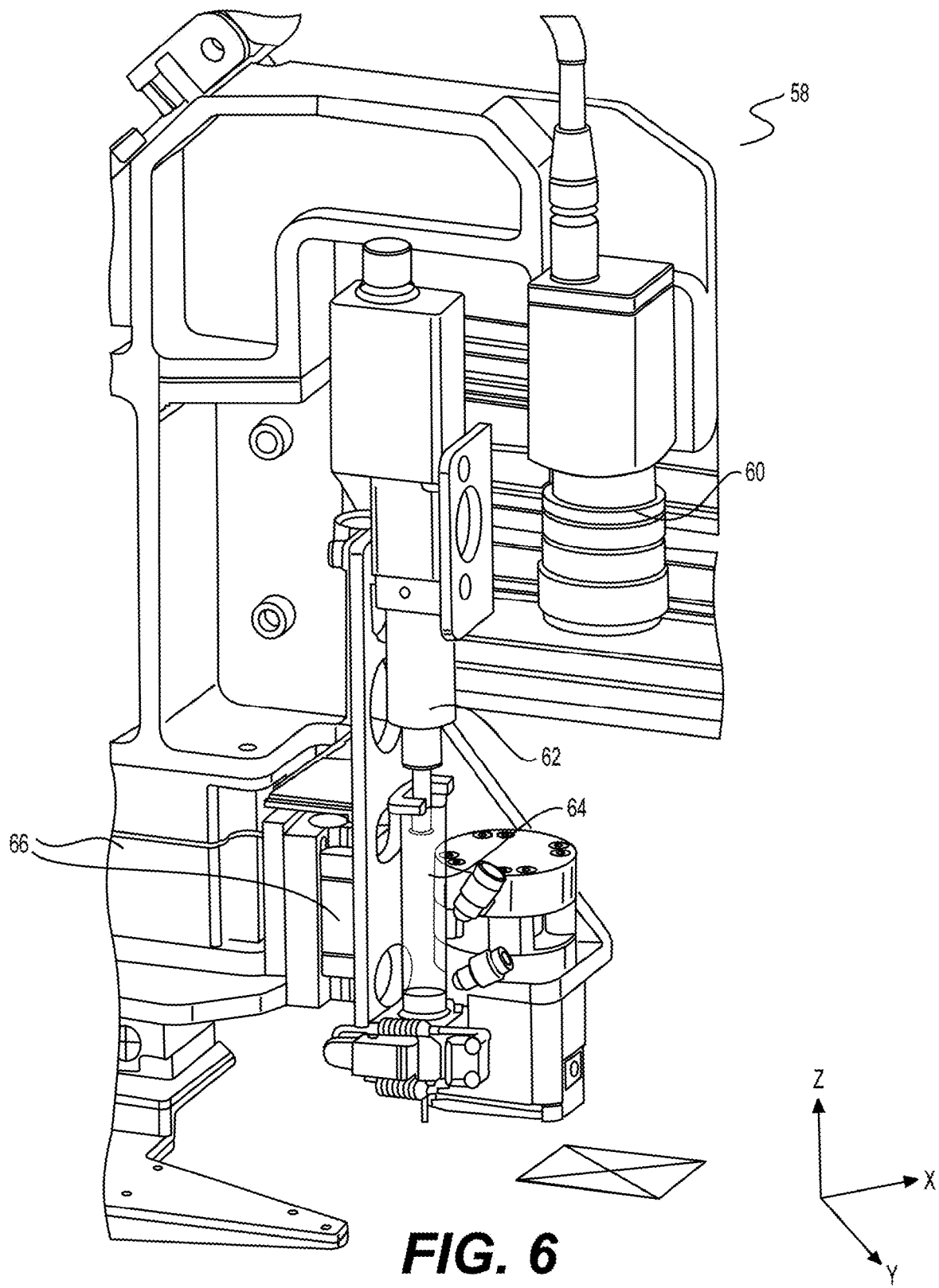
FIG. 6 illustrates a schematically perspective view of an exemplary inspection and ECA dispensing component of the apparatus, in accordance with some embodiments.

FIG. 6 illustrates a schematically perspective view of an exemplary inspection and ECA dispensing component 58, in accordance with some embodiments. Accurately dispensing small amounts of ECA paste onto a metal ribbon segment is challenging and normally requires expensive equipment and feedback. In the present disclosure, a custom designed inspection and ECA dispensing component 58 is mounted to the main stage 26 and provides a low cost but accurate dispensing process. The inspection and ECA dispensing component 58 can include an inspection camera 60, an actuator 62 attached with a push plunger, a replaceable ECA syringe 64, and a travel slide 66.

The inspection camera 60 is introduced to inspect the quality/quantity and location of the prepared metal ribbon segment and/or dispensed ECA which is disclosed above. The inspection camera 60 is also mounted to the main stage, which allows the inspection camera to move and scan the metal ribbon segment in multiple locations. During the manufacturing, a line control (LC) system (not shown) can rely on pictures captured by the inspection camera 60 to determine the quality of the metal ribbon segment or ECA, and decide whether the process should continue. The actuator 62 is configured to push the ECA contained in the replaceable ECA syringe 64 through the attached push plunger to dispense the ECA onto a metal ribbon segment. The actuator 62 can move vertically in Z axis shown in FIG. 6 through the travel slide 66. The travel slide 66 in Z, axis (e.g. vertical direction) can be operated pneumatically, and can adjust positions of the inspection and ECA dispensing component vertically in a range from 0 millimeter to 5 millimeters.

In related examples, the ECA can be dispensed through a pneumatic approach which requires software adjustments to account for ECA viscosity changes. The related examples may be expensive and less accurate. In the present disclosure, a custom design is provided to combine the inspection camera 60 and the mechanical dispensing portion (including mechanical actuator 62, the ECA syringe 64, and the travel slide 66). The disclosed mechanical dispensing portion is a custom designed, low cost and accurate apparatus for ECA dispensing. The inspection camera is introduced to inspect the quality/quantity and location of the metal ribbon segment and dispensed ECA, which can improve the yield and accuracy. In addition, the inspection and ECA dispensing component 58 is combined with the placement gripper component 68 to form the main stage 26. The combination of components 58 and 68 integrates multiple assembly steps, such as the metal ribbon preparation, ECA dispensing, and quality/quantity/location inspection, in a single stage.

Figure 7:
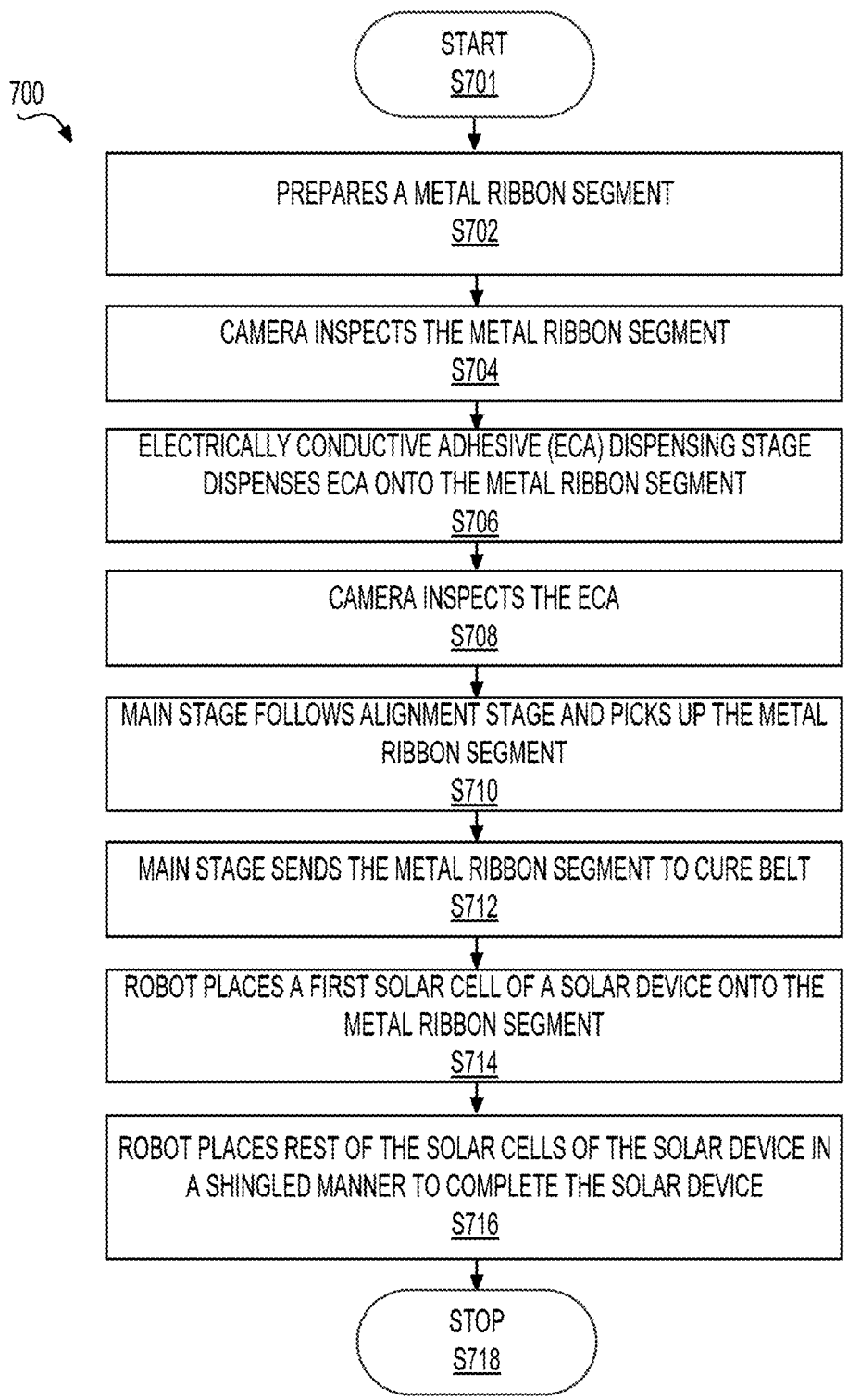
FIG. 7 illustrates an exemplary process flow for fabricating a solar cell device with a metal ribbon on the front side.

FIG. 7 illustrates an exemplary flow outlining a process 700 for assembling a hyper cell 100 according to an embodiment of the disclosure. In an example, the process 700 is performed by the apparatus 300 of FIGS. 4, 5 and 6. The process 700 can prepare a metal ribbon segment and bond the prepared metal ribbon segment with a negative terminal of the hyper cell 100 to enable connections to other solar module components. Shown in FIG. 7, the manufacturing process starts from step S702, where a metal ribbon segment, such as one of the metal ribbon segments 14(1)-14(6), can be prepared for fabricating the hyper cell 100. Referring to FIGS. 4, 5, 6 and as described above, the ribbon reel 38 supplies a roll of metal ribbon. An end of the roll is guided by the ribbon guide pulleys 40, and can pass through a cut window of cutter 34 to wait to be gripped by the gripper A 30. The main stage 26 moves toward the cutter 34 along the X axis shown in FIG. 4 and approaches the metal ribbon. The gripper A 30 attached with the main stage 26 clamps the end of the roll.

Next, the main stage 26 moves away from the cutter 34 along the X axis and stops, and thus the gripper A 30 pulls the end of the roll out to a proper length for a segment of metal ribbon. Then the gripper B 32 clamps on a position of the pullout portion of the metal ribbon to hold the pullout portion. The main stage 26 further pulls the end tight and, in an example, deforms the pullout portion of the metal ribbon by a few millimeters. The supplied metal ribbon may not be always flat. A tensioning and stretching treatment mentioned above can flatten the metal ribbon. A flat metal ribbon helps subsequent manufacturing steps, such as metal ribbon cut and metal ribbon bonding. Subsequently, the cutter 34 moves forward and cuts the metal ribbon, thus the segment of metal ribbon is separated from the roll of the metal ribbon. The prepared metal ribbon segment is then sucked by the vacuum chuck 46 located at the alignment stage 36. The cutter 34 then moves back to original position. The gripper A 30 unclamps the segment of metal ribbon. The metal ribbon segment lies down onto the vacuum chuck 46. The subsequent step can be the main stage 26 (including the gripper A 30) moving away from the cutter 34 along the X axis to original position.

In step S704, also referring to FIGS. 4, 5 and 6, the inspection camera 60 starts to inspect the quality of the prepared metal ribbon segment. Firstly, the vacuum chuck 46 translates in Y axis through the linear travel stage 54. The vacuum chuck 46 moves away from the ribbon dispensing component 28 to a middle position from an initial position. The initial position at which the vacuum chuck 46 is located can be identified as a back position. Comparing to the middle position, the back position of the vacuum chuck 46 is closer to the ribbon dispensing component 28. Following the translation of the vacuum chuck 46 along Y axis, the main stage 26 moves forward to approach the cutter 34 along the X axis through the linear travel stage 50. The main stage 26 then stops when the attached inspection camera 60 reaches a position over the end of the metal ribbon segment adjacent to the cutter 34. The main stage 26 then starts to move backward away from the cutter 34 along the X axis. During the movement of the main stage 26, the inspection camera 60 attached to the main stage 26 can take several pictures of the metal ribbon segment from different locations between the end adjacent to the cutter 34 and the end close to the main stage 26. In an example, the number of the pictures captured by the inspection camera 60 can be 5. The inspection pictures taken by camera 60 can be sent to the line control (LC) system (not shown) and the LC system determines if the quality of the metal ribbon segment is good. If the quality of the metal ribbon segment cannot meet standards of the manufacturing, the metal ribbon segment is rejected by line control system.

The process 700 then proceeds to step S706. In step S706, also referring to FIGS. 4, 5 and 6, the ECA dispensing component 58 dispenses a plurality of ECA 12 onto the prepared metal ribbon segment which is produced in step S702. During the ECA dispensing, the main stage 26 moves toward the cutter 34 again along X axis to a first position. In the first position, the ECA dispensing component 58 which is attached to the main stage 26 hangs over the end of the metal ribbon segment adjacent to the cutter 34. The ECA component 58 then moves down along the Z axis through the travel slide 66 to approach the metal ribbon segment and stop at a top position of the metal ribbon segment. The actuator 62 in the ECA dispensing component 58 therefore pushes the ECA contained in the replaceable ECA syringe 64 through the attached push plunger. The injected ECA is dispensed onto the metal ribbon segment at a first location adjacent to the end. The dispensed ECA forms a first ECA. After the first ECA is dispensed, the ECA component 58 moves up (e.g., moves away from the metal ribbon segment) to an initial position. The main stage 26 now moves away from the cutter 34 to a second position and stops. The ECA dispensing component 58 moves down again and starts to dispense a second ECA onto the metal ribbon segment at a second location. Along with the translation of the main stage 26 away from the cutter 34, a plurality of ECAs can be dispensed onto the metal ribbon segment between two ends.

In step S708, also referring to FIGS. 4, 5 and 6, the inspection camera 60 inspects the quality, quantity and location of the dispensed ECA. Step S708 can be performed simultaneously with the ECA dispensing. The inspection camera 60 can take several pictures of the dispensed ECA as the main stage 26 moves away from the cutter 34. In some embodiments, the number of the pictures can be 5, for example. The captured pictures can be sent to the LC system again to verify the quality and quantity of the ECA. If the quality and/or quantity of the ECA cannot meet the standard of the manufacturing, the ECA will be rejected.

The process now proceeds to step S710 where the main stage 26 picks up the metal ribbon segment from the vacuum chuck 46. In step S710, also referring to FIGS. 4, 5 and 6, the vacuum chuck 46 moves away from the ribbon dispensing component 28 further to a third position from the middle position mentioned above. Comparing to the middle position, the third position to which the vacuum chuck 46 moves is farther to the ribbon dispensing component 28. Following the vacuum chuck 46, the main stage 26 moves toward the cutter 34 along the X axis. The main stage 26 stops at a pick location where the gripper head 56 hangs over the metal ribbon segment lying on the vacuum chuck 46, such as one of the metal ribbon segments 14(1)-14(6). The gripper head 56 in the main stage 26 therefore starts to suck the metal ribbon segment. The suction activity of the gripper head 56 can be controlled by the solenoids 48 in the main stage 26. Once the metal ribbon segment is picked up by the gripper head 56, the main stage 26 lifts up and moves away from the cutter 34 and reaches a placement location. In the placement location, the main stage 26 transfers the metal ribbon segment to a cure belt (not shown).

The process proceeds to step S712 also referring to FIGS. 4, 5 and 6, where the main stage 26 transfers the metal ribbon segment to the cure belt (not shown). During the placement of metal ribbon segment, the gripper head 56 moves forward and down to approach the cure belt, and places the metal ribbon segment onto the cure belt. It should be mentioned that right before the metal ribbon segment is placed onto the cure belt, a robot (not shown) can just pick up and place a last solar cell from the shingle belt (not shown) to the cure belt (not shown) to complete a preceding hyper cell. The last solar cell can be placed with other solar cells of the preceding hyper cell on the cure belt in the shingled manner. Upon the completion of the preceding hyper cell, the cure belt indexes a short distance, such as 100 mm, to receive the metal ribbon segment for fabricating a new hyper cell, such as the hyper cell 100.

The process continues to step S714, In step S714, also referring to FIGS. 4, 5 and 6, the robot picks a first solar cell from the shingle belt (not shown) and places the front surface of the first solar cell onto a metal ribbon segment. The metal ribbon segment can be the one that is placed onto the cure belt (not shown) by the gripper head 56 in step S712. The first solar cell can be the first end solar cell 10-N and the metal ribbon segment can be one of the metal ribbon segments 14(1)-14(6) shown in FIG. 2B. The first end solar cell 10-N is placed onto metal ribbon segment in the shingle manner with ends of the first end solar cell and the metal ribbon segment being overlapped. The metal ribbon segment is conductively bonded to the front surface of the first end solar cell 10-N through an electrically conductive adhesive (ECA), and act as a negative terminal connection.

The process 700 proceeds to step S716, also referring to FIGS. 4, 5 and 6, where the main stage 26 lifts up, moves away from the metal ribbon segment and moves back to the original position. The cure belt (not shown) indexes forward to a next position to receive a subsequent solar cell from the robot (not shown). The robot picks the subsequent solar cell from the shingle belt (not shown) and places the subsequent solar cell onto the first solar cell in a shingled manner. The first solar cell and the subsequent solar cell are connected in series and arranged in the shingled manner with the ends being overlapped. The cure belt can index further, and one or more solar cells can be picked and bonded together to complete the hyper cell 100 with the shingled manner.

In step S718, the manufacturing process 700 stops and then repeats from step S701 to start fabricating a new hyper cell.

It should be noted that additional steps can be provided before, during, and after the exemplary method 700, and some of the steps described can be replaced, eliminated, or moved around for additional embodiments of the method 700. In subsequent process steps, various additional interconnect structures, such as metal ribbons, may be bonded to the hyper cell. Such interconnect structure can be electrically bonded together to form a solar module. Other supporting circuits, such as bypass circuits, and/or power control circuits can be connected to the solar module as well.

With respect to the description provided herein, the present disclosure offers a solar cell device as well as method and apparatus for fabricating the solar cell device. Disclosed herein, a solar module can comprise one or more hyper cells. The hyper cells can be arranged in rows that are connected in parallel or in series. Electrical connections between the hyper cells can be made through metal ribbons. The hyper cell can have a string of solar cells. The string of solar cells can be conductively connected in series and arranged in the shingled manner with adjacent solar cells being overlapped. In the solar module disclosed herein, discrete metal ribbon segments are disposed respectively at end solar cells for different hyper cells, and the discrete metal ribbon segments can be bonded to form the first metal ribbon. The first metal ribbon can be bonded onto the front surface of the solar module at the negative end and form connections between the hyper cells. The solar module can have a second metal ribbon. The second metal ribbon can be continuous and can be bonded onto a rear surface of the solar module at a positive end.

In related examples, both the first metal ribbon and the second metal may be continuous and bonded to the rear surface of the solar module. In the related examples, the solar cells located at the negative end of the solar module may be inactive not to produce electrical power and the inactive solar cells results in output power loss. In the present disclosure, an automated fabrication method can be implemented through the disclosed apparatus to prepare, inspect and bond a metal ribbon segment onto the front surface of a hyper cell at the negative end automatically during an assembly of the hyper cell. The disclosed apparatus conducts multiple steps in a single stage. All the solar cells in the disclosed solar cell device can contribute to the output power. The method and the apparatus disclosed herein provide an automatic manufacturing process with an increased yield and a reduced labor cost.

In the present disclosure, the automated method which is performed through the disclosed apparatus can include preparation (gripping, stretching and cutting) of metal ribbon segment, camera inspection of metal ribbon segment and ECA, dispensing of ECA, and pick and placement of the metal ribbon segment. The custom designed apparatus integrated the procedures/functions of preparation (gripping, stretching and cutting) of metal ribbon segment, camera inspection of metal ribbon segment and ECA, dispensing of ECA, and pick and placement of the ribbon segment in a single stage.

The present disclosure further provides a way different from related examples to dispense the ECA. Accurately dispensing small amounts of ECA paste onto a metal ribbon is challenging and normally requires expensive equipment and feedback. In related examples, the ECA can be dispensed through a pneumatic approach which requires software adjustments to account for ECA viscosity changes. The related examples may be expensive and less accurate. In the present disclosure, the custom designed inspection and ECA dispensing component is mounted to the main stage and provides a mechanical approach to dispense the ECA, which can be low cost as well as accurate. The inspection camera is introduced to inspect the quality, quantity and location of the prepared metal ribbon segment and dispensed ECA, which can improve the yield and accuracy. In addition, the inspection and ECA dispensing component is combined with the placement gripper component to form the main stage. The combination of the inspection and ECA dispensing component and the placement gripper component can integrate multiple assembly steps, such as the metal ribbon preparation, ECA dispensing, and quality/quantity/location inspection, in a single stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a solar cell device from silicon solar cells, the method comprising:
   preparing a first metal ribbon segment;
   inspecting a quality and a location of the first metal ribbon segment after the preparing the first metal ribbon segment, wherein the inspecting is operated by an inspection camera mounted on a main stage;
   dispensing, at the main stage, an electrically conductive adhesive (ECA) onto the first metal ribbon segment;
   inspecting, by the inspection camera mounted on the main stage, the quality and the location of the ECA after the dispensing of the ECA onto the first metal ribbon segment;
   placing a first solar cell onto the first metal ribbon segment, the first metal ribbon segment being bonded with a front surface of the first solar cell through the ECA in a shingled manner with sides of the first metal ribbon segment and the first solar cell being overlapped, and the front surface being configured to face a light incoming direction to receive energy from a light source; and bonding one or more solar cells with the first solar cell through a ECA in a shingled manner with sides of adjacent solar cells being overlapped to form a first string of solar cells.

2. The method of claim 1, wherein dispensing the ECA comprises using a mechanical actuator with an attached push plunger to push the ECA contained in a replaceable ECA syringe through the attached push plunger to dispense the ECA onto the first metal ribbon segment.

3. The method of claim 1, further comprising forming a second string of solar cells and bonding a second metal ribbon segment with the front surface of the first solar cell of the second string.

4. The method of claim 3, further comprising bonding the second metal ribbon segment and the first metal ribbon segment to form a first metal ribbon.

5. The method of claim 3, further comprising bonding a third metal ribbon onto a rear surface at another end of the first string and second string of solar cells, and the rear surface being opposite to the front surface.

6. The method of claim 3, comprising bonding a third metal ribbon onto a rear surface of the first string and second string of solar cells, wherein the third metal ribbon is configured to connect with a bypass circuit, and the rear surface is opposite to the front surface.

7. The method of claim 3, further comprising connecting a return metal ribbon to the first metal ribbon at the rear surface of the solar cell device, wherein the rear surface is opposite to the front surface.

8. A method for manufacturing a shingled solar cell device comprising:

preparing a first metal ribbon segment at a main stage;

inspecting, by an inspection camera mounted on the main stage, the first metal ribbon segment after the preparing the first metal ribbon segment;

dispensing, at the main stage, an electrically conductive adhesive (ECA) onto the first metal ribbon segment;

inspecting, by the inspection camera mounted on the main stage, a quality and a location of the ECA on the first metal ribbon segment; and placing a first solar cell onto the first metal ribbon segment to bond with a first surface of the first solar cell through the ECA in a shingled manner with sides of the first metal ribbon segment and the first solar cell being overlapped.

9. The method of claim 8, wherein the preparing the first metal ribbon segment at the main stage comprises gripping and stretching the first metal ribbon at the main stage.

10. The method of claim 8, wherein the preparing the first metal ribbon segment at the main stage comprises adjusting a position of the main stage with one or more travel stages.

11. The method of claim 8, wherein the inspecting the first metal ribbon segment comprises moving the inspection camera mounted on the main stage to capture a plurality of images of the metal ribbon segment from different locations between ends of the metal ribbon segment.

12. The method of claim 11, wherein the inspecting the first metal ribbon segment comprises capturing approximately five images of different locations between ends of the metal ribbon segment.

13. The method of claim 8, wherein the dispensing, at the main stage, the ECA comprises dispensing the ECA at a plurality of ECA locations between two ends of the first metal ribbon segment by moving the main stage between a plurality of positions.

14. The method of claim 8, wherein the inspecting the quality and the location of the ECA is performed simultaneously with the dispensing of the ECA.

15. The method of claim 8, wherein the inspecting the quality and the location of the ECA comprises moving the inspection camera mounted on the main stage to capture a plurality of images of the dispensed ECA as the main stage moves.

* * * * *